United States Patent [19]

Tassone

[11] Patent Number: 4,597,081
[45] Date of Patent: Jun. 24, 1986

[54] ENCODER INTERFACE WITH ERROR DETECTION AND METHOD THEREFOR

[75] Inventor: Joseph Tassone, Lexington, Mass.

[73] Assignee: Automatix Incorporated, Billerica, Mass.

[21] Appl. No.: 799,271

[22] Filed: Nov. 14, 1985

Related U.S. Application Data

[63] Continuation of Ser. No. 710,943, Mar. 13, 1985, abandoned, which is a continuation of Ser. No. 373,398, Apr. 30, 1982, abandoned.

[51] Int. Cl.⁴ .............................................. G06F 11/00
[52] U.S. Cl. ................... 371/25; 340/347 P; 371/67
[58] Field of Search ............... 371/25, 67; 377/17, 377/45; 340/347 P, 347 SY

[56] References Cited

U.S. PATENT DOCUMENTS

| | | | |
|---|---|---|---|
| 3,663,938 | 5/1972 | Baer | 377/39 |
| 3,860,907 | 1/1975 | Marshal | 371/47 |
| 3,959,770 | 5/1976 | Schaefer | 371/25 |
| 4,060,720 | 11/1977 | Check, Jr. | 371/67 |
| 4,312,070 | 1/1982 | Coombes et al. | 371/47 |

Primary Examiner—Charles E. Atkinson
Attorney, Agent, or Firm—Richard J. Birch

[57] ABSTRACT

An optical encoder interface and method provides encoder position information and performs error checking on each revolution of the encoder. Error checking is achieved by ascertaining that the correct number of encoder counts are obtained for every revolution of the encoder.

4 Claims, 1 Drawing Figure

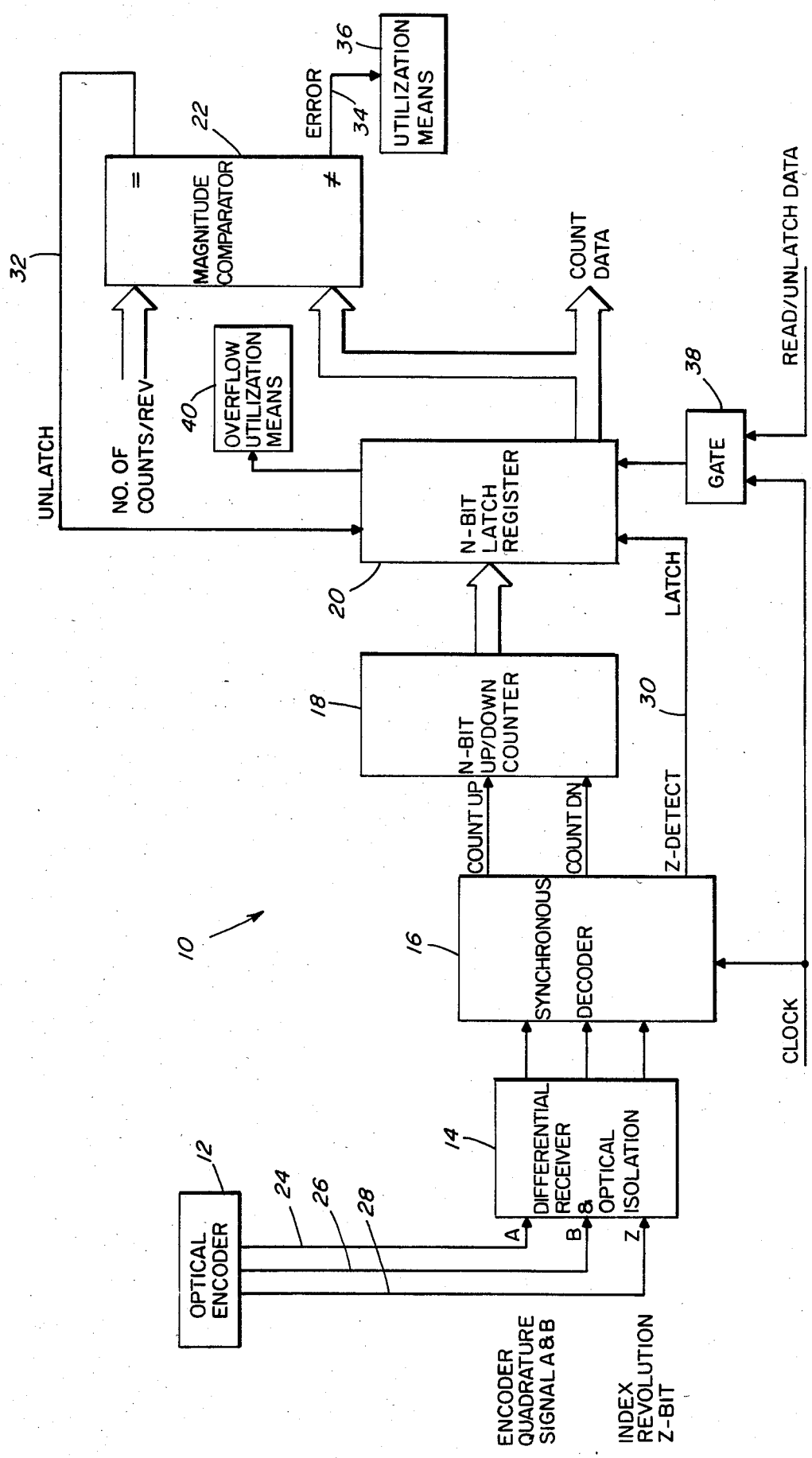

ENCODER INTERFACE WITH ERROR DETECTION AND METHOD THEREFOR

This is a continuation of co-pending application Ser. No. 710,943 filed on Mar. 13, 1985 which is a continuation of co-pending application Ser. No. 373,398 filed on Apr. 30, 1982, both of which are now abandoned.

BACKGROUND OF THE INVENTION

The present invention relates to encoders in general and, more particularly, to an error checking interface for encoders.

Encoders are widely used to determine the angular position of a rotating element. Various types of encoders are known to those in the industry and include widely used optical encoders. Typically, applications for such encoders include use on robot manipulators, machine tools and other mechansims employing position feedback.

Present encoder interfaces receive the encoder quadrature signals and use them to decode a count direction either up or down. In addition to the quadrature direction signals, present encoder interfaces also use an index Zdetection bit to indicate one complete revolution and continue counting. The nature of the low level signals from the optical encoder coupled with the deleterious environment in which they often operate makes then susceptible to electrical noise and prone to erroneous count sequences.

Accordingly, it is a general object of the present invention to provide an improved interface for encoders.

It is a specific object of the invention to provide an encoder interface that utilizes error checking by assuring that the proper number of counts are obtained for each revolution.

It is a further object of the invention to provide an encoder interface which produces error information to permit corrective action to be taken subsequently if an improper number of counts from the encoder is detected.

These objects and other objects and features of the invention will best be understood from a detailed description of a preferred embodiment thereof, selected for purposes of illustration and shown in the accompanying single FIGURE which is a block diagram of the encoder interface of the present invention.

DETAILED DESCRIPTION OF THE INVENTION

Referring to the single FIGURE, there is shown in block diagram form an encoder interface constructed in accordance with the present invention and indicated generally by the reference numeral 10. The encoder interface 10 is used in conjunction with a conventional optical encoder 12 to provide the desired error checking.

The encoder interface 10 comprises a differential receiver 14 having optical isolation, a synchronous decoder 16, an N-bit up/down counter 18, an N-bit latch register 20 and a comparator 22. The receiver 14 differentially receives the encoder quadrature signals A and B on encoder output lines 24 and 26, respectively, and the index revolution Z-bit signal on encoder output line 28. Optical isolation and the differential receiver are employed to achieve increased noise immunity.

The received quadrature signals are decoded by synchronous decoder 16 which determines the phase relationship between the A and B quadrature signals and produces a count-up or a count-down signal depending upon the direction of encoder rotation. The up/down output signals from synchronous decoder 16 are used to clock the up/down counter 18 which keeps a running tally of the position of the optical encoder 12.

The synchronous decoder 16 also decodes the received index Z-bit that occurs once per revolution of the optical encoder 12. The index signal is decoded in the proper phase relationship with respect to the quadrature signals to reduce the probability of error. The decoded Z-detect signal from synchronous decoder 16 is inputted to the N-bit latch register 20 by means of Z-detect latch line 30. The latching of the N-bit register value does not effect the up/down counter 18 which keeps counting up or down as necessary.

The latched value in N-bit latch register 20 is compared in comparator 22 with a predetermined, fixed number that represents the correct number of counts per revolution of the optical encoder 12 which is characterized by a number of counts for each revolution. The output from comparator 22 is either an "equal" signal or an "unequal" signal, i.e. error signal. A comparator output of "equal" produces an unlatch or reset signal on line 32 to the latch register 20. The "equal" signal resets the latch register 20 and the latch register stores a new value from the counter 18 corresponding to the last monitored revolution of optical encoder 12. A "not equal" comparison produces an error signal on line 34 which is inputted to a suitable utilization means 36. The utilization means 36, in response to error signal 34, can be used to correct the count or take any other appropriate action, such as providing a fail/safe indication.

The latch register 20 can be unlatched once the data is read. A read gate 38 is used in connection with the N-bit latch register 20 to prevent the reading of the register in the transparent mode when the counter value is changing. Thus, missing counts and extraneous counts can be easily handled.

Missing index Z-bit signals can be accomodated through the N-bit latch register overflow utilization means 40. If the Z-bit is missing, register 20 at some point will produce an overflow signal to overflow utilization means 40. The overflow utilization means can then provide a suitable fail/safe indication. Since extraneous Z-detect signals are not likely to occur because they are decoded in conjunction with the quadrature signal, no provision is made for handling the extraneous Z-detect signals.

Having described in detail a preferred embodiment of my invention, it will now be apparent to those skilled in the art that numerous modifications can be made therein without departing from the scope of the invention as defined in the following claims.

What I claim and desire to secure by Letters Patent of the United States is:

1. An interface for use with an encoder that produces first and second quadrature encoder signals and an index revolution signal, said interface comprising:
   1. means coupled to said encoder for synchronously decoding (i) said first and second quadrature encoder signals to produce a count-up or count-down signal depending upon the direction of encoder rotations and, (ii) the index revolution signal in phase relationship with said first and second quadrature encoder signals to produce a latch signal;
2. N-bit up/down counter means responsive to said up/down signal from said synchronous decoder means;
3. an N-bit latch register means for holding the count of said up/down counter means in response to said latch signal;
4. a comparator means for comparing the count on said N-bit latch register means with a predetermined count representing the correct number of counts per encoder revolution and producing from the comparison either (i) a count equal signal that resets the N-bit latch register means or (ii) a count unequal error signal; and,
5. utilization means responsive to said count-unequal error signal.

2. An interface for use with an encoder that produces first and second quadrature encoder signals and an index revolution signal, said interface comprising:
1. differential receiver means for receiving said first and second quadrature encoder signals and said index revolution signal;
2. means coupled to said received means for synchronously decoding (i) said first and second received quadrature encoder signals to produce a count-up or count-down signal depending upon the direction of encoder rotations and, (ii) the index revolution signal in phase relationship with said first and second quadrature encoder signals to produce a latch signal;
3. N-bit up/down counter means responsive to said up/down signal from said synchronous decoder means;
4. an N-bit latch register means for holding the count of said up/down counter means in response to said latch signal;
5. a comparator means for comparing the count on said N-bit latch register means with a predetermined count representing the correct number of counts per encoder revolution and producing from the comparison either (i) a count equal signal that resets the N-bit latch register means or (ii) a count unequal error signal; and,
6. utilization means responsive to said count-unequal error signal.

3. An error checking method for use with an encoder that produces first and second quadrature encoder signals and an index revolution signal, said method comprising the steps of:
1. synchronously decoding (i) said first and second received quadrature encoder signals to produce a count-up or count-down signal depending upon the direction of encoder rotations and, (ii) the index revolution signal in phase relationship with said first and second quadrature encoder signals to produce a latch signal;
2. counting the up/down signals;
3. holding the count of said up/down signals in response to said latch signal;
4. comparing the held count with a predetermined count representing the correct number of counts per encoder revolution and producing from the comparison either (i) a count equal signal that resets the N-bit latch register means or (ii) a count unequal error signal; and,
5. utilizing said count-unequal error signal.

4. An error checking method for use with an encoder that produces first and second quadrature encoder signals and an index revolution signal, said method comprising the steps of:
1. receiving said first and second quadrature encoder signals and said index revolution signal;
2. synchronously decoding (i) said first and second received quadrature encoder signals to produce a count-up or count-down signal depending upon the direction of encoder rotations and, (ii) the index revolution signal in phase relationship with said first and second quadrature encoder signals to produce a latch signal;
3. counting the up/down signals;
4. holding the count of said up/down signals in response to said latch signal;
5. comparing the held count with a predetermined count representing the correct number of counts per encoder revolution and producing from the comparison either (i) a count equal signal that resets the N-bit latch register means or (ii) a count unequal error signal; and,
6. utilizing said count-unequal error signal.

* * * * *